(12) United States Patent
Bayerer et al.

(10) Patent No.: US 9,888,563 B2
(45) Date of Patent: Feb. 6, 2018

(54) ELECTRONICS ASSEMBLY WITH INTERFERENCE-SUPPRESSION CAPACITORS

(71) Applicant: Infineon Technologies AG, Neubiberg (DE)

(72) Inventors: Reinhold Bayerer, Reichelsheim (DE); Andre Arens, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/261,080

(22) Filed: Sep. 9, 2016

(65) Prior Publication Data
US 2017/0079132 A1    Mar. 16, 2017

(30) Foreign Application Priority Data

Sep. 10, 2015    (DE) .................. 10 2015 115 271

(51) Int. Cl.
*H02M 7/00*    (2006.01)
*H05K 1/02*    (2006.01)
(Continued)

(52) U.S. Cl.
CPC .......... *H05K 1/0231* (2013.01); *H02M 1/44* (2013.01); *H02M 7/003* (2013.01);
(Continued)

(58) Field of Classification Search
CPC .. H02M 7/003; H02M 2001/123; H02M 1/44; H05K 1/0203; H05K 1/0231;
(Continued)

(56) References Cited

U.S. PATENT DOCUMENTS 4,490,626 A    12/1984 Carlson
4,514,649 A    4/1985 Nuzillat
(Continued)

FOREIGN PATENT DOCUMENTS

DE    102007024413 A1    12/2007
DE    102007058556 A1    6/2008
(Continued)

OTHER PUBLICATIONS

Bayerer, Reinhold, "Parasitic inductance hindering utilization of power devices", 9th International Conference on Integrated Power Electronics Systems, Proceedings of CIPS 2016, Mar. 8-10, 2016, pp. 1-8.
(Continued)

*Primary Examiner* — Adam B Dravininkas
(74) *Attorney, Agent, or Firm* — Murphy, Bilak & Homiller, PLLC

(57) ABSTRACT

An electronics assembly includes a plurality of first semiconductor chips each having a first load terminal and a second load terminal, a conductor structure having a first conductor strip, a second conductor strip and a third conductor strip, a plurality of first interference-suppression capacitors arranged on the conductor structure and each having a first capacitor terminal and a second capacitor terminal, and a heat sink. The first load terminal of each first semiconductor chip is electrically connected to the first conductor strip, the second load terminal of each first semiconductor chip is electrically connected to the third conductor strip, the first capacitor terminal of each first interference-suppression capacitor is electrically connected to the first conductor strip, the second capacitor terminal of each first interference-suppression capacitor is electrically connected to the second conductor strip, and the heat sink is electrically connected to the second conductor strip.

21 Claims, 7 Drawing Sheets

(51) Int. Cl.
  *H02M 1/44* (2007.01)
  *H05K 1/18* (2006.01)
  *H02M 1/12* (2006.01)

(52) U.S. Cl.
  CPC ......... *H05K 1/0203* (2013.01); *H05K 1/0204* (2013.01); *H05K 1/181* (2013.01); *H05K 1/185* (2013.01); *H02M 2001/123* (2013.01); *H05K 2201/10015* (2013.01)

(58) Field of Classification Search
  CPC ......... H05K 3/0061; H05K 2201/0209; H05K 1/056; H05K 3/30; H05K 1/0243; H05K 1/0204; H05K 1/162; H05K 1/185; H05K 1/181; H05K 2201/10015
  See application file for complete search history.

(56) References Cited

U.S. PATENT DOCUMENTS

| | | | |
|---|---|---|---|
| 4,766,481 A | 8/1988 | Gobrecht et al. | |
| 5,038,267 A | 8/1991 | De Doncker et al. | |
| 5,150,287 A | 9/1992 | Gruning | |
| 5,261,747 A | 11/1993 | Deacutis et al. | |
| 5,404,273 A * | 4/1995 | Akagawa | H01L 23/057 174/538 |
| 5,574,312 A | 11/1996 | Bayerer et al. | |
| 7,466,185 B2 | 12/2008 | Bayerer | |
| 7,548,825 B2 | 6/2009 | Bayerer et al. | |
| 7,561,446 B1 | 7/2009 | Vinciarelli | |
| 7,768,337 B2 | 8/2010 | Bayerer | |
| 7,791,208 B2 | 9/2010 | Bayerer | |
| 7,808,100 B2 | 10/2010 | Bayerer | |
| 8,018,047 B2 | 9/2011 | Bayerer et al. | |
| 8,120,391 B2 | 2/2012 | Bayerer et al. | |
| 8,146,513 B2 | 4/2012 | Ibaiondo Madariaga et al. | |
| 8,154,114 B2 | 4/2012 | Bayerer | |
| 8,212,413 B2 | 7/2012 | Jansen et al. | |
| 8,228,113 B2 | 7/2012 | Domes | |
| 8,441,128 B2 | 5/2013 | Domes | |
| 8,487,407 B2 | 7/2013 | Bayerer et al. | |
| 8,649,198 B2 | 2/2014 | Kuzumaki et al. | |
| 2005/0007047 A1 | 1/2005 | Strothmann et al. | |
| 2006/0197491 A1 | 9/2006 | Nojima | |
| 2007/0158859 A1 | 7/2007 | Hierholzer | |
| 2007/0176626 A1 | 8/2007 | Bayerer et al. | |
| 2007/0290311 A1 | 12/2007 | Hauenstein | |
| 2008/0042164 A1 * | 2/2008 | Kanschat | H01L 24/06 257/133 |
| 2008/0106319 A1 | 5/2008 | Bayerer | |
| 2008/0135932 A1 | 6/2008 | Ozeki et al. | |
| 2009/0016088 A1 * | 1/2009 | Bayerer | H01L 24/24 363/125 |
| 2009/0039498 A1 * | 2/2009 | Bayerer | H01L 23/3735 257/700 |
| 2009/0085219 A1 | 4/2009 | Bayerer | |
| 2009/0153223 A1 | 6/2009 | Bayerer | |
| 2009/0261472 A1 | 10/2009 | Bayerer | |
| 2010/0065962 A1 | 3/2010 | Bayerer et al. | |
| 2010/0066175 A1 | 3/2010 | Jansen et al. | |
| 2010/0085105 A1 | 4/2010 | Bayerer et al. | |
| 2010/0164601 A1 | 7/2010 | Jansen | |
| 2010/0254163 A1 | 10/2010 | Martini et al. | |
| 2011/0019453 A1 | 1/2011 | Gonzalez Senosiain et al. | |
| 2011/0075451 A1 | 3/2011 | Bayerer et al. | |
| 2011/0102054 A1 | 5/2011 | Domes | |
| 2011/0216561 A1 | 9/2011 | Bayerer et al. | |
| 2012/0112775 A1 | 5/2012 | Domes | |
| 2012/0206948 A1 | 8/2012 | Maldini et al. | |
| 2012/0281442 A1 | 11/2012 | Revelant et al. | |
| 2013/0043593 A1 * | 2/2013 | Domes | H01L 23/3735 257/758 |
| 2013/0062750 A1 * | 3/2013 | Lenniger | H01L 23/473 257/691 |
| 2013/0134572 A1 * | 5/2013 | Lenniger | H01L 23/367 257/690 |
| 2013/0200859 A1 | 8/2013 | Jiang-Häfner et al. | |
| 2016/0219705 A1 | 7/2016 | Bayerer | |

FOREIGN PATENT DOCUMENTS

| | | |
|---|---|---|
| DE | 102008049193 A1 | 1/2011 |
| DE | 102012218670 A1 | 4/2013 |
| DE | 102015101086 A1 | 4/2015 |
| EP | 427143 A2 | 5/1991 |

OTHER PUBLICATIONS

Bayerer, Reinhold et al., "Power Circuit Design for Clean Switching", 2010 6th International Conference on Integrated Power Electronics Systems (CIPS), Mar. 16-18, 2010, pp. 1-6.

* cited by examiner

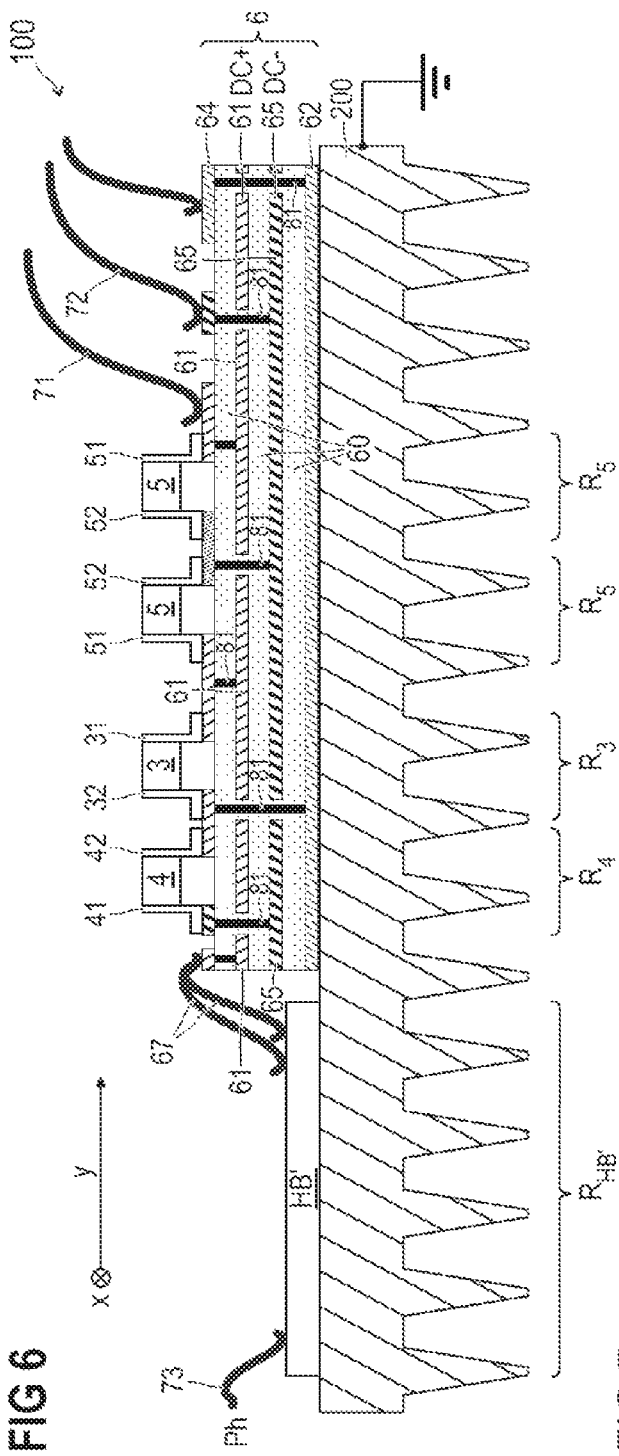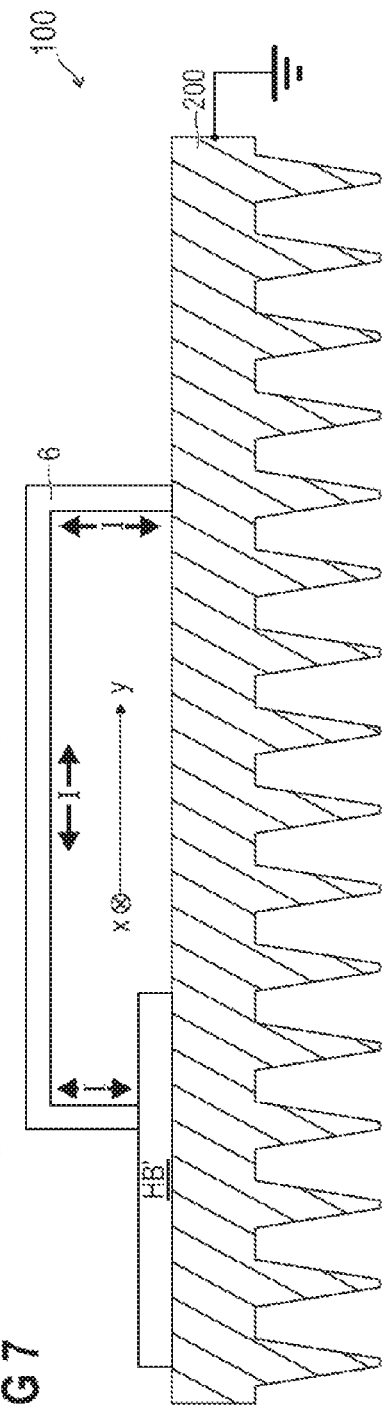

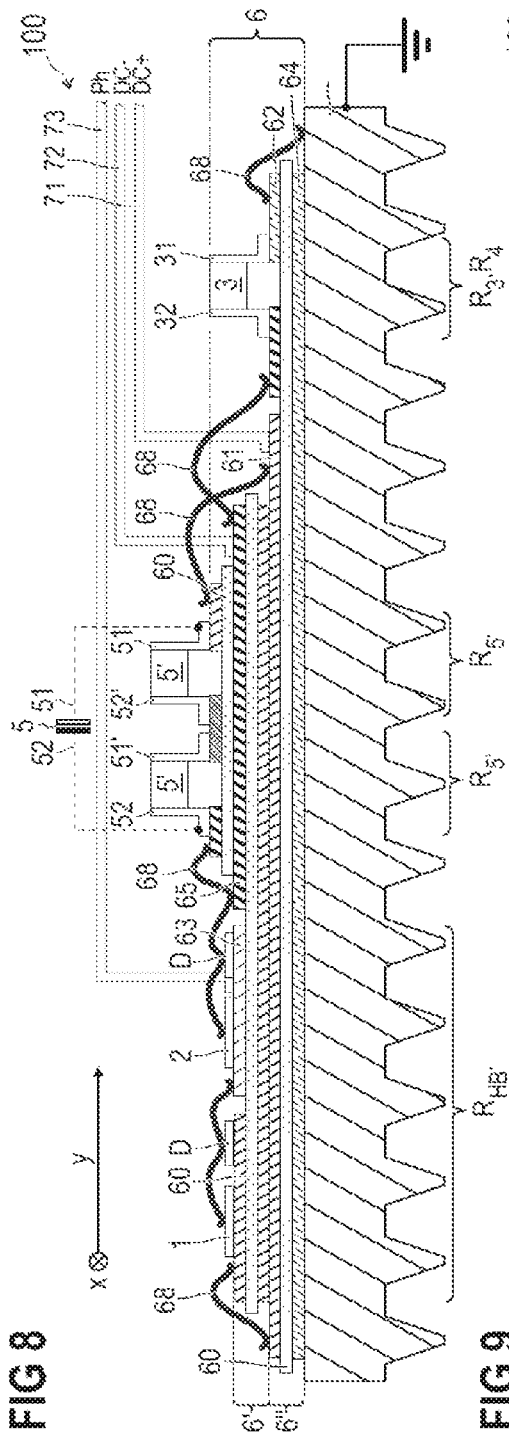
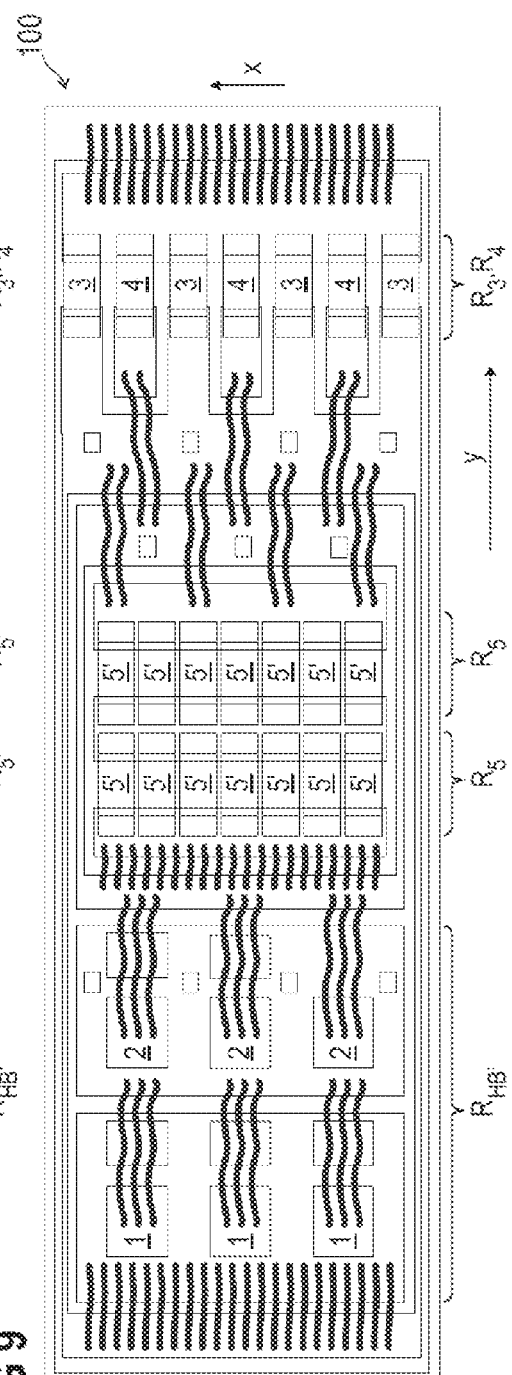
FIG 8
FIG 9

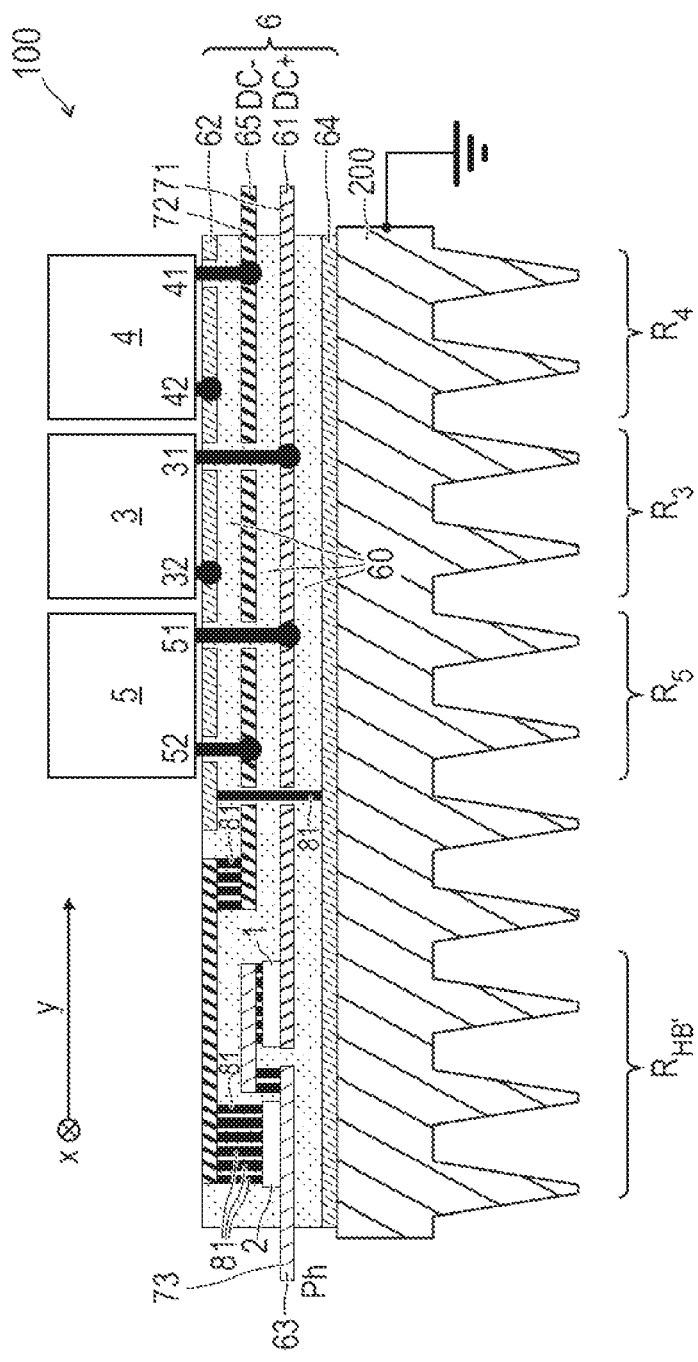

ELECTRONICS ASSEMBLY WITH INTERFERENCE-SUPPRESSION CAPACITORS

PRIORITY CLAIM

This application claims priority to German Patent Application No. 10 2015 115 271.1 filed on 10 Sep. 2015, the content of said application incorporated herein by reference in its entirety.

TECHNICAL FIELD

The invention relates to electronics assemblies having interference-suppression capacitors.

BACKGROUND

Electronics assemblies, such as for example inverters, often contain electronic semiconductor switches. The switching operations of the semiconductor switches cause undesired interference signals, which spread in a line-bound form or in the form of electromagnetic radiation.

Among the factors responsible for interference signals that enter the power system supplying the electronics assembly are unavoidable stray capacitances, which the electronics assembly or a unit connected to the electronics assembly has with respect to ground or with respect to a heat sink, which during operation is generally at ground potential. Such stray capacitances may exist for example between ground and internal electrical connecting lines of the electronics assembly, between ground and an electrical connecting lead by which an electrical load (for example a motor) is connected to the electronics assembly, between ground and a component part of the load, and so on. If a DC link is present, it can likewise contribute to the stray inductance.

FIG. 1 shows a circuit of an electronics assembly 100 formed as an inverter. The electronics assembly 100 includes two semiconductor switches S1 and S2, the load paths of which are connected in series with a half-bridge. The half-bridge is supplied with a supply voltage by a voltage source 900, for example a rectifier bridge. An electrical load L is connected by way of a connecting lead 906 to an output 103 (also referred to as phase output Ph) of the electronics assembly 100, which at the same time represents an output of the half-bridge.

The electronics assembly 100 has various assembly-internal stray capacitances C1-C3, and also various assembly-internal stray inductances L1, L2 and LZ.

Further stray capacitances C4 (connecting lead 906) and C5 (load) are assembly-external stray capacitances.

C1 is the output stray capacitance of the electronics assembly, C2 is the stray capacitance of the connecting line 901 for distributing the positive supply potential DC+, and C3 is the stray capacitance of the connecting line 902 for distributing the negative supply potential DC−.

L1 is the stray inductance of the connecting line 901 for distributing the positive supply potential DC+, and L2 is the stray inductance of the connecting line 902 for distributing the negative supply potential DC−, and LZ is the stray inductance of a DC link capacitor.

Altogether, the stray capacitances are responsible for so-called common-mode interferences, which produce interferences on the ground line of the system. Differential interferences are caused primarily by the stray inductances and couple into the phases of the system.

It is usually attempted to keep the stray capacitance C1 at the output 103 of the half-bridge, and consequently the interferences caused by it, as small as possible. However, the reduction in the interferences that is brought about by this measure is often insignificant, since in practice the sum of the external stray capacitances C4 and C5 is often much greater than C1.

Furthermore, to reduce interferences, it is often attempted to choose the capacitances C2 and C3 to be as equal in magnitude as possible, which usually requires a special, complex construction of the electronics assembly.

In order to reduce the interferences caused by the stray capacitance C4+C5, which in comparison with C1 is usually very much external to the module, interference-suppression capacitors C+ and C− are often provided between ground and the connecting line 901 for distributing the positive supply potential DC+ and between ground and the connecting line 902 for distributing the negative supply potential DC−. With the aid of the interference-suppression capacitors C+, C−, the interference circuits within the electronics assembly are shorted with respect to the heat sink (which is at ground), so that the interfering currents flowing via the system ground are prevented, or at least reduced significantly. However, these interference-suppression capacitors C+, C− are in turn accompanied by internal stray inductances L+ and L−, which makes the interference emissions of the assembly worse. Furthermore, interference-suppression capacitors are conventionally affected by significant additional stray inductance in the connecting lines to ground and to DC+ and DC−.

SUMMARY

Embodiments described herein reduce interferences occurring during the operation of an electronics assembly as a result of stray inductances and/or stray capacitances in comparison with conventional electronics assemblies.

One aspect concerns an electronics assembly. This has a number of first semiconductor chips with in each case a first load terminal and a second load terminal. Furthermore, the electronics assembly has a conductor structure with a first conductor strip, a second conductor strip and a third conductor strip, and also a number of first interference-suppression capacitors, each of which is arranged on the conductor structure and has a first capacitor terminal and also a second capacitor terminal. The electronics assembly also has a heat sink. The first load terminal of each first semiconductor chip is connected in an electrically conducting manner to the first conductor strip, the second load terminal of each first semiconductor chip is connected in an electrically conducting manner to the third conductor strip, the first capacitor terminal of each first interference-suppression capacitor is connected in an electrically conducting manner to the first conductor strip, and the second capacitor terminal of each first interference-suppression capacitor is connected in an electrically conducting manner to the second conductor strip. Furthermore, the heat sink is connected in an electrically conducting manner to the second conductor strip. During the operation of such an electronics assembly, the heat sink may be connected to ground.

Those skilled in the art will recognize additional features and advantages upon reading the following detailed description, and upon viewing the accompanying drawings.

BRIEF DESCRIPTION OF THE DRAWINGS

The invention will be explained in greater detail with reference to the following figures. In this case, the figures are

FIG. 6 shows a cross section through a second example of an electronics assembly.

FIG. 7 shows a cross section through a third example of an electronics assembly.

FIG. 8 shows a cross section through a fourth example of an electronics assembly, FIG. 9 shows a plan view of the electronics assembly according to FIG. 8.

FIG. 10 shows a cross section through a fifth example of an electronics assembly.

DETAILED DESCRIPTION

Unless anything to the contrary is mentioned, the features explained on the basis of the various exemplary embodiments may be combined with one another in any way desired.

In the description that follows, some of the elements are referred to as "first", "second", "third" or the like. It is pointed out in this connection that such a designation merely serves for distinguishing between various elements. If, for example, a third element (for example a third conductor strip) is present, this does not mean that a corresponding first element and second element (for example a first conductor strip and second conductor strip) must also be present.

Figure 1:
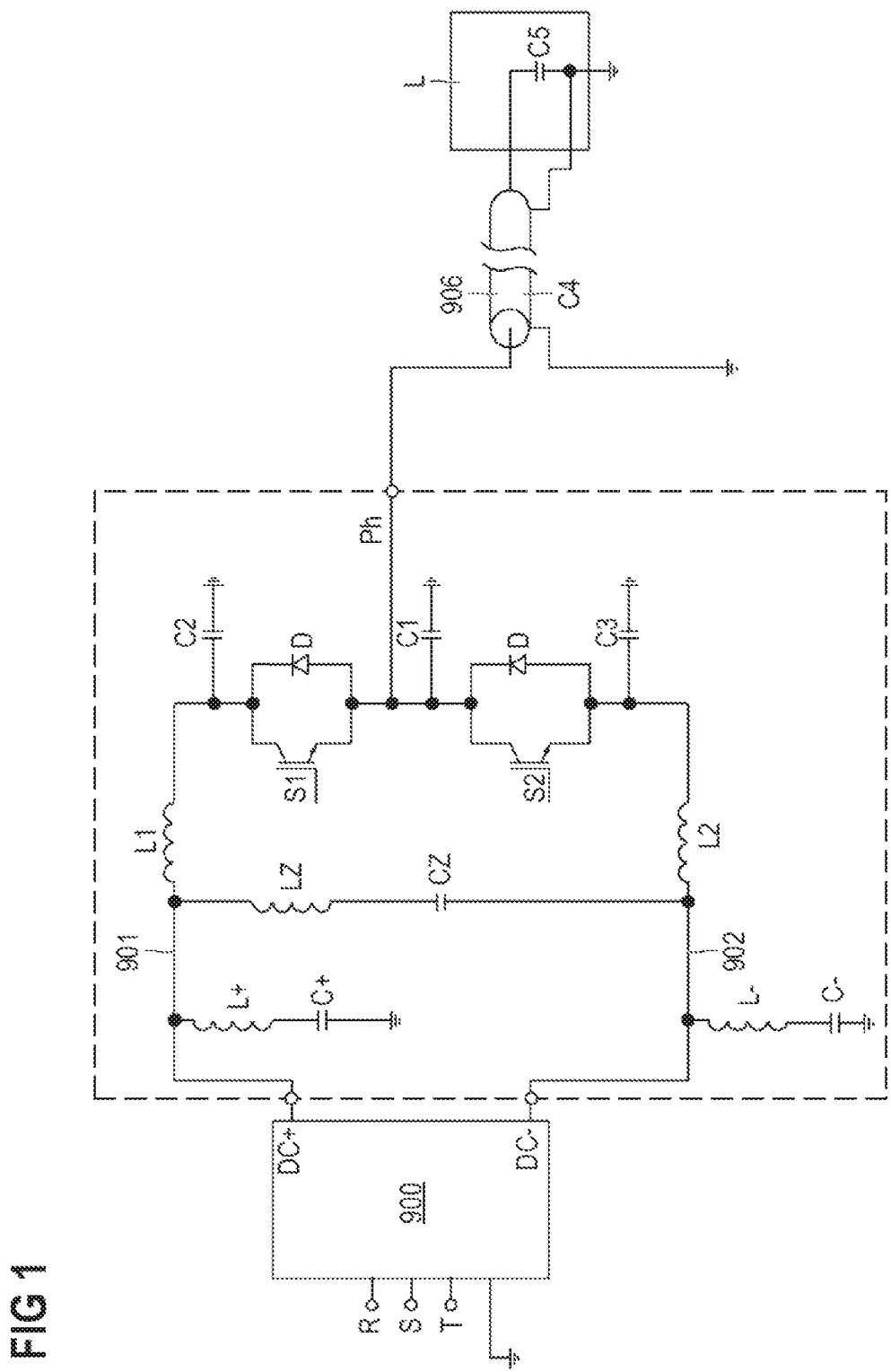
FIG. 1 shows a circuit diagram of an electronics assembly.
Figure 2:
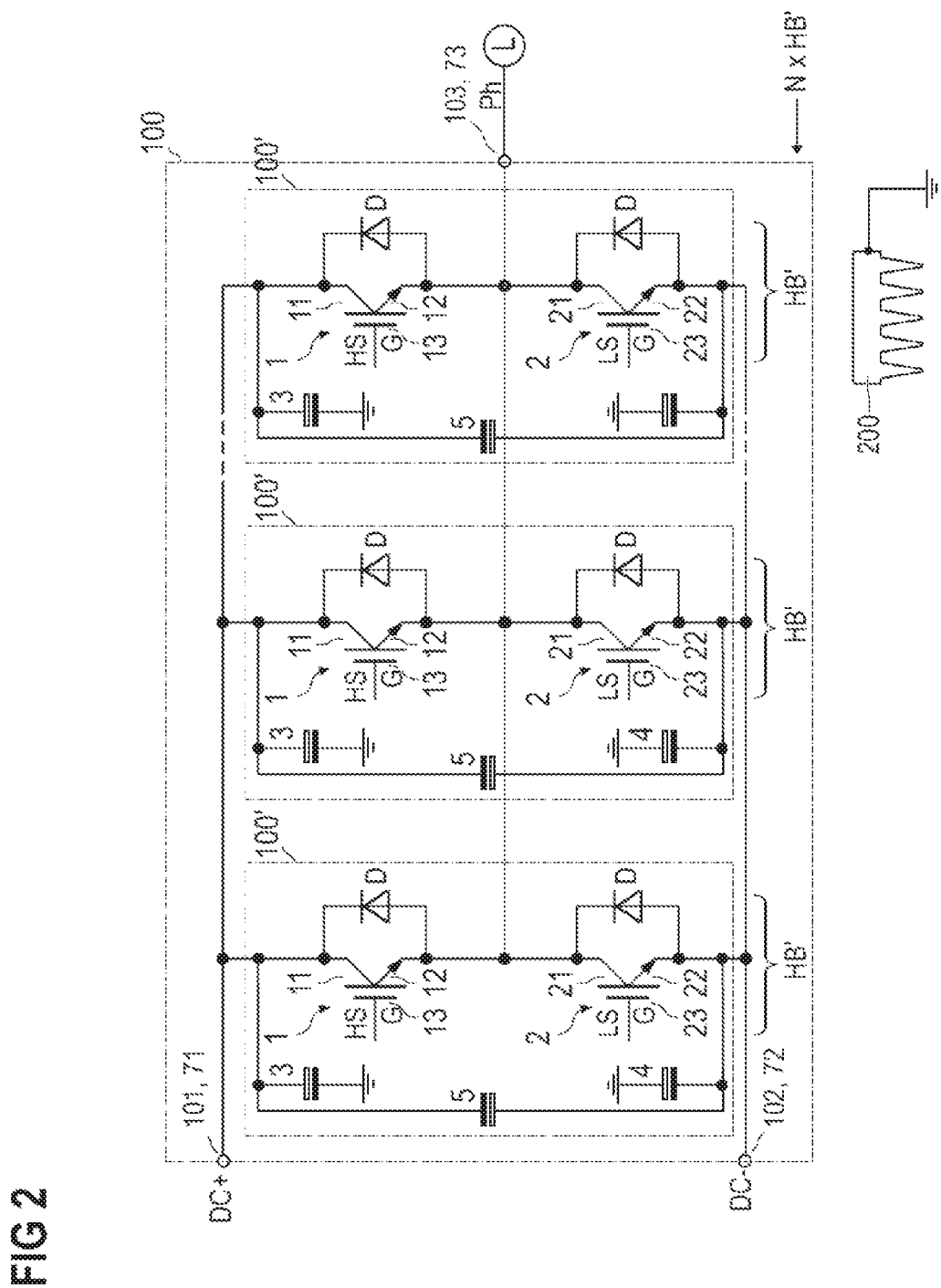
FIG. 2 shows a circuit diagram of an electronics assembly with multiple subassemblies connected electrically in parallel.

With reference to FIG. 2, one aspect is to replace interference-suppression capacitors C+, C−, such as are shown in FIG. 1, in each case by a number of interference-suppression subcapacitors 3 and 4, which are respectively arranged one behind the other on a conductor structure (see in the subsequent figures the reference numeral 6). The sum of the capacitances of all of the interference-suppression subcapacitors 3 then gives a total interference-suppression capacitance that corresponds to the capacitance of the interference-suppression capacitor C+. By analogy with this, the sum of the capacitances of all of the interference-suppression subcapacitors 4 gives a total interference-suppression capacitance that corresponds to the capacitance of the interference-suppression capacitor C−.

The fact that a certain interference-suppression capacitance C+ is formed by a multiplicity of interference-suppression subcapacitors 3 connected electrically in parallel instead of by one interference-suppression capacitor, and the fact that the multiplicity of interference-suppression subcapacitors 3 connected electrically in parallel are arranged one behind the other respectively in one or more rows on a conductor structure means that there is a reduction in the stray inductance L+ that is caused by the interference-suppression capacitance C+.

By analogy with this, the fact that a certain interference-suppression capacitance C− is formed by a multiplicity of interference-suppression subcapacitors 4 connected electrically in parallel instead of by one interference-suppression capacitor, and the fact that the multiplicity of interference-suppression subcapacitors 4 connected electrically in parallel are arranged one behind the other respectively in one or more rows on a conductor structure means that there is a reduction in the stray inductance L− that is caused by the interference-suppression capacitance C−.

As can also be seen from FIG. 2, an electronics assembly 100 may have multiple subgroups 100', the component parts of which are respectively arranged one behind the other on a conductor structure 6 and are connected electrically in parallel. The parallel connection may in this case take place entirely or partially by means of the conductor structure 6.

FIG. 2 shows by way of example a number of subgroups 100, which may optionally—as shown—be constructed identically. Each of the subgroups 100 has a half-bridge HB'. Each half-bridge HB' includes a first semiconductor chip 1 and a second semiconductor chip 2, which are respectively formed merely by way of example as an n-channel IGBT. In principle, the first semiconductor chip 1 and the second semiconductor chip 2 may be formed independently of one another and in any desired combinations with one another, as p-channel components or as n-channel components, and/or as normally-on components or as normally-off components.

In any event, the first semiconductor chip 1 has a first load terminal 11 and a second load terminal 12, between which a first load path is formed, and the second semiconductor chip 2 has a first load terminal 21 and a second load terminal 22, between which a second load path is formed. The first load path and the second load path are connected electrically in series between a first switching node 101 and a second switching node 102 of the electronics assembly 100. For this purpose, the second load terminal 12 of the first semiconductor component 1 is electrically connected to the first load terminal 21 of the second semiconductor component 2.

The first switching node 101 may for example be a first external electrical terminal of the electronics assembly 100. Correspondingly, the second switching node 102 may for example be a second external electrical terminal 102 of the electronics assembly 100. "External terminals" of the electronics assembly 100 are generally understood as meaning terminals at which the electronics assembly 100 can be electrically connected from the outside, that is to say terminals that are accessible from the outside of the electronics assembly 100.

Among the types of components that come into consideration for the first semiconductor chip 1 and the second semiconductor chip 2 are controllable semiconductor switches, which have a control terminal 13 or 23, by means of which the first load path or the second load path of the semiconductor chip 1 or 2 concerned can, depending on an electrical activation potential applied to the control terminal 13, 23, be optionally put into a conducting state (semiconductor chip is switched on, i.e. its load path is conducting) or into a blocking state (semiconductor chip is switched off, i.e. its load path is non-conducting). Similarly, however, the first semiconductor chip 1 and/or the second semiconductor chip 2 may also be a semiconductor component without a control terminal, for example a diode.

Suitable types of components for the first semiconductor chip 1 and the second semiconductor chip 2 are for example semiconductor switches with a control terminal, such as for example MOSFETs (Metal Oxide Semiconductor Field-Effect Transistors), IGBTs (Insulated Gate Bipolar Transistors), JFETs (Junction Field-Effect Transistors), HEMTs (High Electron Mobility Transistors), thyristors or the like, or semiconductor chips without a control terminal, such as for example diodes.

Depending on the type of component, the first/second load terminal 11/12, 21/22 of the same semiconductor chip 1, 2 may be for example drain and source terminals or be source and drain terminals or be emitter and collector terminals or be collector and emitter terminals or be anode/cathode terminals or be cathode/anode terminals, and—if the semiconductor chip 1, 2 is controllable—the control terminal 13, 23 may be a gate terminal or a base terminal.

An electronics assembly 100 may be any desired power converter, inverter or other power-electronic semiconductor module. It may for example have a rectifier circuit or an inverter circuit, or a circuit for activating a—for example inductive—load M, for example of a motor.

The semiconductor chips 1, 2 may be lateral or vertical components. In the case of a vertical semiconductor chip 1, 2, it has a semiconductor body, and the first load terminal and the second load terminal are arranged on opposite sides of this semiconductor body.

As shown, an optional freewheeling diode D may be respectively connected antiparallel in relation to the load path of each of the semiconductor chips 1, 2. Such freewheeling diodes D may optionally also be integrated in the semiconductor component 1, 2 concerned. In principle, it is also possible to arrange such freewheeling diodes D outside the electronics assembly 100.

The electronics assembly has an output 103, which is substantially at the same electrical potential as the second load terminal 12 of the first semiconductor component 1 and the first load terminal 21 of the second semiconductor component 2 of each half-bridge HB'.

The first supply potential DC+ may for example be greater than the second supply potential DC−. For example, the difference between the first supply potential DC+ and the second supply potential V− may be permanently or at least temporarily at least 10 V, at least 100 V or even at least 500 V. The voltage that is present between the first switching node 101 and the second switching node 102, that is to say the potential difference between DC+ and DC−, may be in particular a direct voltage, or at least a voltage that has a significant direct voltage component, for example a DC link voltage of an inverter.

Figure 3:
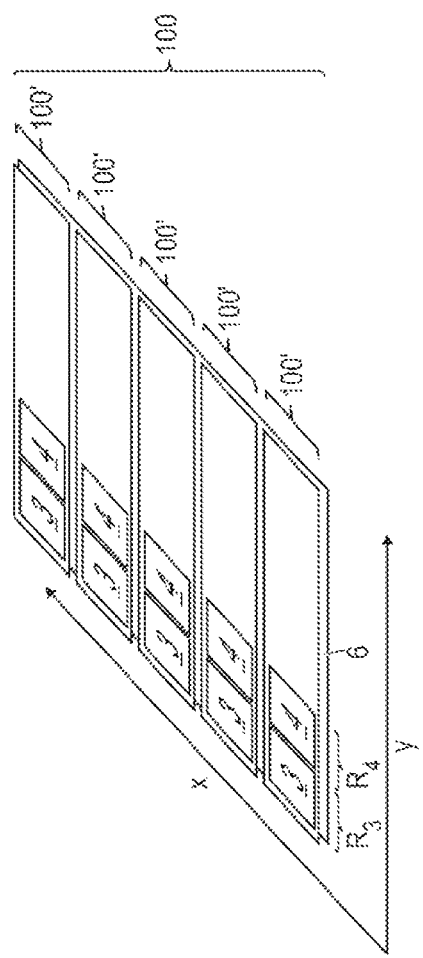
FIG. 3 shows multiple subassemblies according to FIG. 2 arranged one behind the other.

FIG. 3 schematically shows the subgroups 100' arranged one behind the other in a first direction x on a conductor structure 6. For reasons of clarity, of the component parts of the subgroups 100', only the interference-suppression capacitors 3 and 4 are shown in each case. The other component parts of the subgroups 100' may however be arranged in the same way one behind the other in the first direction x on the conductor structure 6 and be connected electrically in parallel. As in the case of all the other configurations, here the load current flowing through the electronics assembly 100 may on average flow in a second direction y, which extends perpendicularly or approximately perpendicularly to the first direction x. As a result, a very low-inductance construction and operation of the electronics assembly 100 can be achieved.

Figure 4:
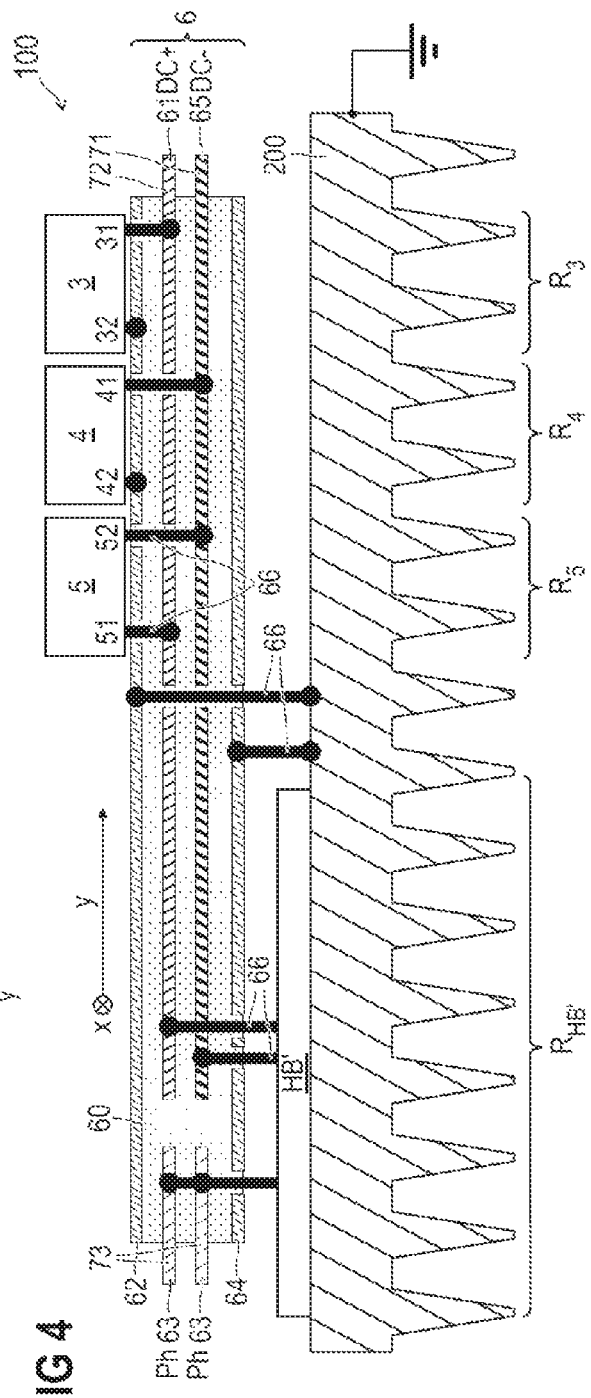
FIG. 4 shows a cross section through a first example of an electronics assembly.
Figure 5:
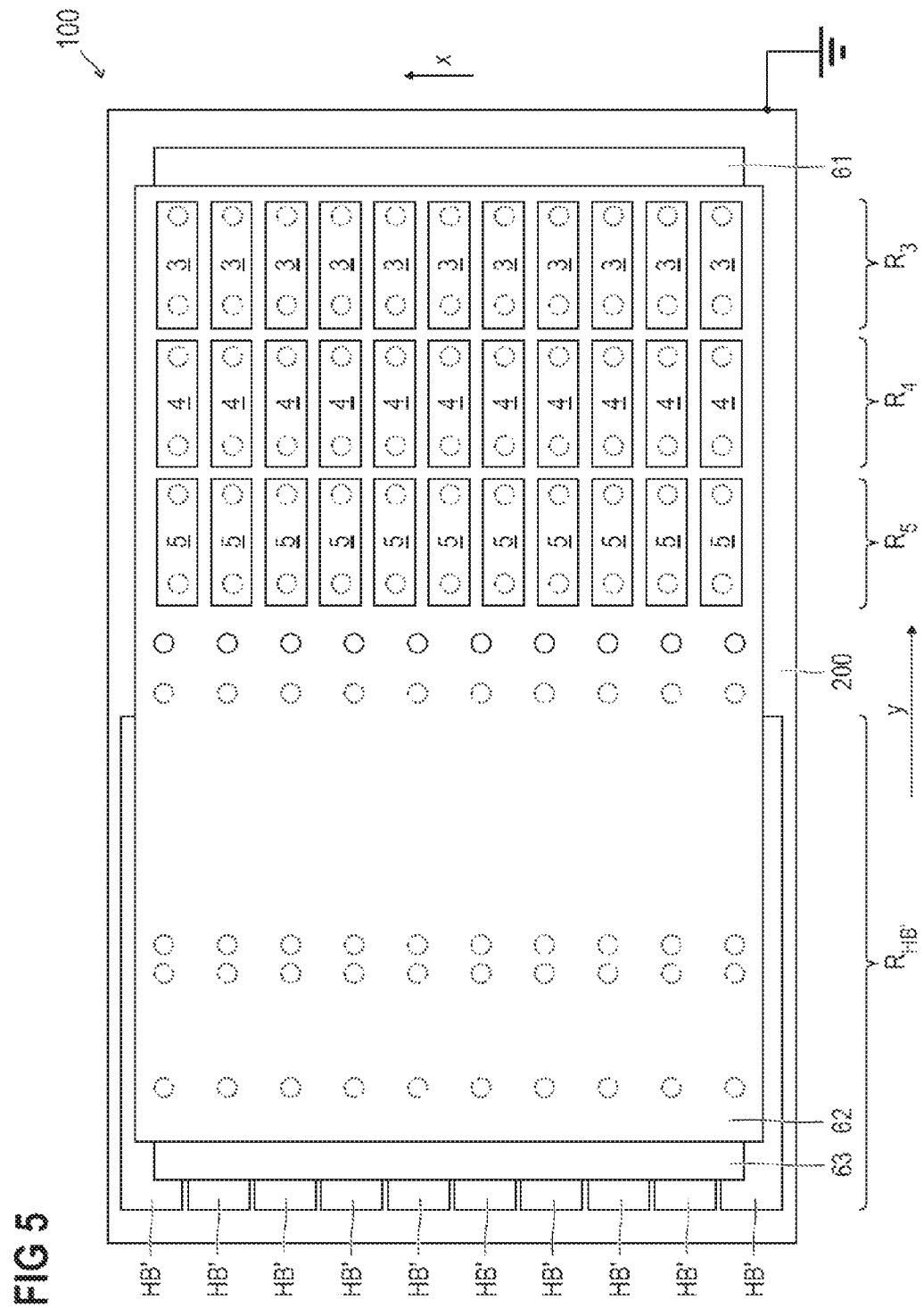
FIG. 5 shows a plan view of the electronics assembly according to FIG. 4.

FIGS. 4 and 5 show in cross section and in plan view a first example, in which the conductor structure 6 is formed as a circuit board (for example as a PCB or as a metallized ceramic circuit carrier or as a laminated busbar assembly or as air-insulated plates, which are mounted on the heat sink 200 with the aid of supports). The viewing direction according to FIG. 4 corresponds to the first direction x. The conductor structure 6 may have multiple electrically conducting first to fifth conductor strips 61, 62, 63, 63', 64, 65, which are electrically insulated from one another by a dielectric 60 (for example plastic or ceramic). As also in the case of all the other configurations, the conductor strips 61-65 may have a good electrical conductivity. They may for example consist of copper or a copper alloy with a high copper content.

Conductor strips 61-65, which are at the same electrical potential (apart from potential drops that are caused by ohmic resistances of the conductor strips), are shown in the figures with the same hatching in each case.

A conductor structure 6 has multiple conductor layers, in which the conductor strips 61-65 are formed. The uppermost conductor layer is formed by the second conductor strip 62, and the lowermost conductor layer is formed by the fourth conductor strip 64. Both, and consequently also the conductor structure 6, are electrically connected to an electrically conducting heat sink 200 by means of electrical connections 66.

The second conductor layer (from above) includes the first conductor strip 61, and also a conductor strip 63, and the third conductor layer (from above) includes the fifth conductor strip 65, and also a conductor strip 63'. The conductor strips 63 and 63' are connected to one another in an electrically conducting manner by one or more electrical connections 66.

During operation, the first conductor strip 61 is at the potential DC+, the second conductor strip 62 is at the potential DC−, and the two conductor strips 63, 63' are at the same potential as the second load terminals 12 of the first semiconductor chips 1 and the first load terminals 21 of the second semiconductor chips 2, i.e. at the potential of the output 103 of the electronics assembly 100 (see FIG. 2). Each of the half-bridges HB' includes at least one or two or more first semiconductor chips 1, the first load paths 11-12 of which in the case of multiple first semiconductor chips 1 are connected in parallel, and also at least one or two or more second semiconductor chips 2, the second load paths 21-22 of which in the case of multiple second semiconductor chips 2 are connected in parallel. Furthermore, each of the first load paths 11-12 is connected electrically in series with each of the second load paths 21-22.

In principle, any desired types of connections in any desired combinations with one another may be used as electrical connections 66, for example via holes of the circuit board, press-in pins, soldered connections, screw connections, and so on.

As a departure from the representations shown here, the electrical connections 66 do not necessarily have to be arranged in the same sectional plane. Rather, different connections 66—in particular also in the first direction x—may be located at different, various positions.

The row $R_{HB'}$ with the half-bridges HB' arranged one behind the other in the first direction x may be arranged entirely or partially between the heat sink 200 and the conductor structure 6. Alternatively, the row $RB_{HB'}$ with the half-bridges HB' arranged one behind the other in the first direction x may also be arranged laterally (y direction) next to the conductor structure 6 on the heat sink 200 and be connected in an electrically conducting manner to the interference-suppression capacitors 3 and 4 located thereupon.

As a result of the first conductor strip 61, carrying the positive supply potential DC+, and the fifth conductor strip 65, carrying the negative supply potential DC−, being arranged between the second and fourth conductor strips 62 and 64, which are both at ground or heat-sink potential, interferences that come from the first and fifth conductor strips 61, 65 are advantageously shielded.

For the electrical contacting of the electronics assembly 100, portions of some of the metallization levels of the circuit board may protrude out of the dielectric 60 thereof and thus serve as electrical terminals 71 for feeding a positive supply potential DC+, 72 for feeding a negative supply potential DC− and 73 for connecting a load L (FIG. 2).

At least one row R3 and/or R4 is arranged on the conductor structure 6, a row R3 having a number of first interference-suppression capacitors 3, which are arranged one behind the other in the first direction x, and a row R4 having a number of second interference-suppression capacitors 4, which are arranged one behind the other in the first direction x.

Each of the first interference-suppression capacitors has a first capacitor terminal 31 and a second capacitor terminal 32, and each of the second interference-suppression capacitors 4 has a first capacitor terminal 41 and a second capacitor terminal 42. The first capacitor terminals 31 of the first interference-suppression capacitors 3 are connected in an electrically conducting manner to the first conductor strip 61, and the second capacitor terminals 32 of the first interference-suppression capacitors 3 are connected in an electrically conducting manner to the second conductor strip 62. Furthermore, the first capacitor terminals 41 of the second interference-suppression capacitors 5 are connected in an electrically conducting manner to the fifth conductor strip 65, and the second capacitor terminals 42 of the second interference-suppression capacitors 4 are connected in an electrically conducting manner to the fourth conductor strip 64.

Optionally, on the conductor structure 6 there may also be arranged at least one row R5, which has a number of DC link capacitors 5, which are arranged one behind the other in the first direction x.

Each of the DC link capacitors 5 has a first capacitor terminal 51, which is connected in an electrically conducting manner to the first conductor strip 61, and also a second capacitor terminal 52, which is connected in an electrically conducting manner to the fifth conductor strip 65.

Here, as in the case of all the other configurations of the invention, interference-suppression capacitors 3 and/or 4 may be capacitors of class Y according to the standard IEC 60384-1 (in the version applicable on Sep. 10, 2015). In particular, these capacitors 3 and/or 4 may correspond to one of the subclasses Y1, Y2, Y3 or Y4.

Furthermore, likewise as in the case of all of the other configurations of the invention, the DC link capacitors 5 may be capacitors of class X of the standard IEC 60384-1 (in the version applicable on Sep. 10, 2015). In particular, these capacitors 5 may correspond to one of the subclasses X1, X2 X3.

FIG. 6 shows a further configuration, in which, as explained, the conductor structure 6 is formed as a circuit board (for example as a PCB or as a metallized ceramic circuit carrier or as a laminated busbar assembly or as air-insulated plates, which are mounted on the heat sink 200 with the aid of supports). As shown, the electrical interconnection between different metallization levels of the conductor structure 6, and consequently also the electrical interconnection between different conductor strips 61-65, may take place exclusively with the aid of via holes 81 of the circuit board.

As also revealed by FIG. 6, the row RHB' with the half-bridges HB' arranged one behind the other in the first direction x may be arranged laterally next to the conductor structure 6 on the heat sink 200 and be connected in an electrically conducting manner to the conductor structure 6 and (if present) the first and second interference-suppression capacitors 3 and/or 4 and DC link capacitors 5 located thereupon, by means of connecting elements 67, for example bonding wires or other electrical connecting elements.

The conductor structure 6 may be fastened directly to the heat sink 200, for example by means of a soldered, sintered or electrically conducting adhesive connection, so that an electrically conducting connection between the heat sink 200 and the conductor strip or strips 62, 64 to be connected to ground (i.e. to the heat sink 200) is produced. The connection may in this case be directly between the heat sink 200 and one of the conductor strips to be connected to ground (here: 62).

Here too, as shown, the first conductor strip 61, carrying the positive supply potential DC+, and the fifth conductor strip 65, carrying the negative supply potential DC−, may be arranged at least partially between the second and fourth conductor strips 62 and 64, which are both at ground or heat-sink potential.

Furthermore, here too, the second conductor strip 62 and the fourth conductor strip 64 are connected in an electrically conducting manner to an electrically conducting heat sink 200.

As likewise revealed by the example according to FIG. 6, (if present) the first interference-suppression capacitors 3, the second interference-suppression capacitors 4 and the DC link capacitors 5 may be formed as SMD capacitors (SMD=Surface Mounted Device).

As also shown in FIG. 6, an electronics assembly 100 may also have two or more rows $R_5$, each of which has a number of DC link capacitors 5, which are arranged one behind the other in the first direction x. The DC link capacitors 5 of the two or more rows $R_5$ are connected electrically in parallel.

FIG. 7 illustrates a topology of an electronics assembly 100, which can be implemented with any configuration of the invention. In FIG. 7, I denotes the load current flowing through the electronics assembly 100, i.e. the current between the terminal 71 and the terminal 73, when the first semiconductor chips 1 are conducting and the second semiconductor chips 2 are non-conducting, and the current between the terminal 72 and the terminal 73, when the first semiconductor chips 1 are non-conducting and the second semiconductor chips 2 are conducting. The topology mentioned is chosen such that, at a point in time at which the amount of the current assumes its maximum value, the average direction of current flow of this current I extends perpendicularly or substantially perpendicularly to the first direction x. Accordingly, although a conductor structure 6 may be planar or substantially planar, this is not absolutely necessary, as long as the stated criterion is satisfied. For example, the conductor structure 6 may have a distinctly nonplanar topology (for example curved or made up of variously oriented circuit boards), which is intended to be shown by the representation according to FIG. 7.

Overall, the current I flows approximately along a band (i.e. in the direction of the band) and is distributed as homogeneously as possible in the direction transverse to the direction of the band (i.e. over the width of the band). Depending on the switching state, the current I flows along a wide first band between the terminal 71 and the terminal 73 when the first semiconductor chips 1 are conducting and the second semiconductor chips 2 are non-conducting and flows along a wide second band between the terminal 72 and the terminal 73 when the first semiconductor chips 1 are non-conducting and the second semiconductor chip 2 are conducting. It is advantageous if the first band and the second band extend as parallel as possible and extend parallel at a distance that is as small as possible.

A homogeneous distribution of the current I over the entire width of the bands can be achieved by a multiplicity of identical individual elements (for example a multiplicity of first semiconductor chips 1 for implementing a first switch S1 according to FIG. 1, a multiplicity of second semiconductor chips 2 for implementing a second switch S2 according to FIG. 1) being arranged one behind the other in one or more rows respectively extending transversely in relation to the direction of the band.

For simplicity, the loading of the conductor structure 6 with components is not shown in FIG. 7. It can however be performed in a way corresponding to the other configurations explained.

As shown in cross section with reference to FIG. 8 and in plan view in FIG. 9, a conductor structure 6 may also be made up of two or more circuit subboards 6', 6" (for example as PCBs or as metallized ceramic circuit carriers or as laminated busbar assemblies). For example, two adjacent circuit subboards 6', 6" may be connected to one another on their mutually facing sides by means of a solder layer or an electrically conducting or electrically insulating adhesive layer or a layer of a sintered metal powder. The electrical interconnection between different metallization levels of the conductor structure 6 may be configured entirely without via holes of the circuit subboards 6', 6" involved. Instead, electrical connections between different metallization levels of the conductor structure 6 are implemented exclusively by means of electrical connecting elements 68 (for example bonding wires, small metal bands), which are arranged completely outside the conductor structure 5.

As also revealed by FIGS. 8 and 9, two or more DC link capacitors 5' may be connected in series, in order to obtain a DC link capacitor 5 with greater dielectric strength, which has a first terminal 51 that is electrically connected to a first conductor strip 61 and a second terminal 52 that is electrically connected to a fifth conductor strip 65. An equivalent circuit diagram for a DC link capacitor 5, which is formed by two DC link capacitors 5' connected in series, is shown in FIG. 8.

Multiple series connections of this type, comprising two or more DC link capacitors 5', may in turn be connected electrically in parallel and be arranged one behind the other in the first direction x. In this case there may be two or more rows $R_5'$, each of which has a number of DC link capacitors 5', which are arranged one behind the other in the first direction x.

The DC link capacitors 5' may also be capacitors of class X according to the standard IEC 60384-1 (in the version applicable on Sep. 10, 2015). In particular, these capacitors 5' may correspond to one of the subclasses X1, X2 or X3.

The electrical terminals 71 for feeding a positive supply potential DC+, 72 for feeding a negative supply potential DC− and 73 for connecting a load L (FIG. 2) may be formed for example as bent terminal plates, which are respectively connected at at least one bottom point in an electrically conducting manner to one of the metallization levels of the conductor structure 6 and/or one of the conductor strips 61-65. The corresponding connections may be produced for example by soldering or welding (in particular ultrasonic welding) or sintering. In the plan view according to FIG. 9, the terminals 71, 72 and 73 are not represented for the sake of better clarity. Only the connecting locations at which the bottom points of the terminals 71, 72 and 73 are connected to the associated metallization level or the associated conductor strip 61-65 are shown.

FIG. 10 also shows a further configuration, in which the conductor structure is formed as a circuit board (PCB or metallized ceramic circuit carrier or laminated busbar assembly) and in which the electrical interconnection between different metallization levels of the conductor structure 6, and consequently also the electrical interconnection between different conductor strips 61-65, takes place exclusively with the aid of via holes 81 of the circuit board. The first and second semiconductor chips 1, 2 and also, if present, freewheeling diodes D (FIG. 2) are embedded in the circuit board. If present, the rows $R_3$ with the first interference-suppression capacitors 3, $R_4$ with the second interference-suppression capacitors 4 and $R_5$ with the DC link capacitors 5 are in turn arranged on the conductor structure 6. Such rows $R_3$, $R_4$, $R_5$ extend in turn in the first direction x. The capacitors 3, 4, 5 may optionally likewise be embedded in the PCB.

The conductor structure 6 may be fastened directly to the heat sink 200, for example by means of a soldered, sintered or electrically conducting adhesive connection, so that an electrically conducting connection between the heat sink 200 and the conductor strip or strips 62, 64 to be connected to ground (i.e. to the heat sink 200) is produced. The connection may in this case be directly between the heat sink 200 and one of the conductor strips to be connected to ground (here: 64).

For the electrical contacting of the electronics assembly 100, portions of some of the metallization levels of the circuit board may protrude out of the dielectric 60 thereof and thus serve as electrical terminals 71 for feeding a positive supply potential DC+, 72 for feeding a negative supply potential DC− and 73 for connecting a load L (FIG. 2).

The mounting of the capacitors 3, 4 and 5 on the conductor structure 6 may be performed in any desired way of those explained above. In particular, the capacitors 3, 4 and 5 may alternatively also be formed as SMD components.

With the present invention it is no longer necessary to make the stray capacitances C2 and C3 (see FIG. 1) as equal in magnitude as possible. Accordingly, the ratio between the stray capacitance C2 (i.e. a stray capacitance that is formed between a first terminal 71 for feeding a positive supply potential DC+ and the third conductor strip 63) and the stray capacitance C3 (i.e. a stray capacitance that is formed between a second terminal 72 for feeding a negative supply potential DC− and the third conductor strip 63) may be less than 0.5 or greater than 2.0.

With the present invention, the stray inductance in relation to the interference-suppression capacitors and also for DC link capacitors is reduced drastically as compared with conventional arrangements, so that the interferences that are caused by external capacitances are reduced more effectively.

All of the configurations of the invention may have the following features. These features may be combined with one another in any way desired:

The conductor strips 61-65 (if present) may extend parallel to one another.

The first conductor strip 61 (DC+) and the fifth conductor strip 65 (DC−) may be at a distance of less than 5 mm or even less than 1 mm.

The second conductor strip (ground) and the fourth conductor strip (ground) may be at a distance of less than 20 mm or even less than 5 mm.

All of the conductor strips 61-65 (if present) of the conductor structure 6 may be formed as planar layers that are parallel to one another.

A row $R_3$ may for example have at least two or even at least four first interference-suppression capacitors 3, which are arranged one behind the other in the first direction x.

A row $R_4$ may for example have at least two or even at least four first interference-suppression capacitors 4, which are arranged one behind the other in the first direction x.

A row $R_5$ may for example have at least two or even at least four first DC link capacitors 5, which are arranged one behind the other in the first direction x.

The total capacitance resulting from the parallel connection of the first interference-suppression capacitors 3 may be chosen to be very great, for example greater by a factor of 5 than the greatest of the interference capacitances C1, C2, C3, C4 and C5.

The total capacitance resulting from the parallel connection of the second interference-suppression capacitors 4 may be chosen to be very great, for example greater by a factor of 5 than the greatest of the interference capacitances C1, C2, C3, C4 and C5.

The total capacitances from the first interference-suppression capacitors 3 and the total capacitance from the second interference-suppression capacitors 4 may be chosen to be equal in magnitude within component tolerances.

If in the case of the conductor structure 6 two of its conductor strips 61-65 are considered, these two conductor strips have a total stray inductance LS. The first conductor strip 61 (DC+) and the fifth conductor strip (DC−) are an example of two such conductor strips. In FIG. 1, their total stray inductance corresponds to the sum of L1 and L2. The same applies correspondingly for example also to the pair with the first conductor strip 61 (DC+) and the third conductor strip 63 (Ph), or to the pair with the fifth conductor strip 65 (DC−) and the third conductor strip 63 (Ph).

The stray inductance LS can be determined approximately by the equation $LS = \mu \cdot A \cdot B \cdot L/B$, where $\mu = \mu_r \cdot \mu_o$ gives the permeability constant of the dielectric 60 between the two conductor strips, A gives their distance apart, B gives the width over which the two conductor strips extend transversely to the first direction x, and L gives the length over which the two conductor strips extend in the first direction x.

The distance A depends on the (minimum) insulation distances, which in turn depend on the voltage class for which the electronics assembly 100 is designed. The length L results from the space requirement for the components 1, 2, 3, 4, 5 (if present) and the required creepage paths, if the surfaces of the two conductor strips are exposed to air. In order to avoid such creepage paths, the electronics assembly 100 may optionally be potted with a dielectric potting compound, for example a silicone gel. Such a potting compound may for example extend from the heat sink 200 to over the semiconductor chips 1 and 2, and/or to over the interference-suppression capacitors 3 and/or 4, and/or over the DC link capacitors 5. The length L may for example lie in the range from 0.5 cm to 10 cm. The inductance can be reduced almost at will by choosing or increasing the width B. The ratio of width B to distance A may for example be greater than 10.

Generally, a lower stray inductance LS is required for higher currents that are to be switched by the electronics assembly 100 (i.e. the currents over the terminal Ph), since high currents are generally also accompanied by great changes in current (i.e. the derivative dI/dt of the current I on the basis of time t assumes high absolute values), which in combination with a high stray inductance LS would lead to high induction voltages.

For this reason, the stray inductance LS may be chosen depending on the current I to be switched. The sum of the rated currents of the first semiconductor chips 1 or the sum of the rated currents of the second semiconductor chips 2 may be taken as a basis for determining the current I to be switched. Furthermore, depending on the voltage class for which the electronics assembly 100 is designed, different maximum permissible limiting values may be prescribed for the product LS·I, higher maximum permissible limiting values applying for higher voltage classes.

For a voltage VDC (this is the difference between DC+ and DC−) of 600 V, the product of LS·I may be less than 10 μVs or less than 5 μVs or even less than 2 μVs. The stated maximum limiting values (10 μVs, 5 μVs and 2 μVs) for the product LS·I may be linearly adapted if the voltage VDC deviates from the reference voltage 600 V. If the voltage VDC is for example 900 V, this is greater than the reference voltage of 600 V by a factor of 1.5. Accordingly, for a voltage VDC of 900 V. the product of LS·I could be less than 15 μVs(=1.5·10 μVs) or less than 7.5 μVs(=1.5·5 ∥Vs) or even less than 3 μVs(=1.5·2 μVs).

A half-bridge HB' mounted on a heat sink 200 may be connected on its side facing the heat sink 200 in an electrically conducting manner to the heat sink 200 (see for example FIGS. 6, 7, 8 and 10).

An electronics assembly 100 can, but does not necessarily have to, have one or more half-bridges. For example, an electronics assembly 100 may have first semiconductor chips 1, but no second semiconductor chips 2. Similarly, an electronics assembly 100 may have second semiconductor chips 2, but no first semiconductor chips 1. The same applies correspondingly to the first interference-suppression capacitors 3 and the second interference-suppression capacitors 4.

Otherwise, an electronics assembly 100 may include any desired circuits, for example a 3-level inverter, a multilevel inverter, a matrix inverter or an NPC inverter (NPC=Neutral Point Clamped).

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronics assembly, comprising:
    a plurality of first semiconductor chips each comprising a first load terminal and a second load terminal;
    a conductor structure comprising a first conductor strip, a second conductor strip and a third conductor strip;
    a plurality of first interference-suppression capacitors arranged on the conductor structure and each comprising a first capacitor terminal and a second capacitor terminal; and
    a heat sink, wherein the first load terminal of each first semiconductor chip is electrically connected to the first conductor strip, wherein the second load terminal of each first semiconductor chip is electrically connected to the third conductor strip, wherein the first capacitor terminal of each first interference-suppression capacitor is electrically connected to the first conductor strip, wherein the second capacitor terminal of each first interference-suppression capacitor is electrically connected to the second conductor strip, wherein the heat sink is electrically connected to the second conductor strip.

2. The electronics assembly of claim 1, wherein the first interference-suppression capacitors are arranged in a row which extends in a first direction.

3. The electronics assembly of claim 1, wherein the number of first interference-suppression capacitors is greater than or equal to the number of first semiconductor chips.

4. The electronics assembly of claim 1, wherein the first interference-suppression capacitors are capacitors of class Y according to the standard IEC 60384-1.

5. The electronics assembly of claim 1, wherein the first interference-suppression capacitors are surface mounted devices.

6. The electronics assembly of claim 1, further comprising a plurality of second semiconductor chips each comprising a first load terminal and a second load terminal, wherein the conductor structure further comprises a fifth conductor strip, wherein the first load terminal of each second semiconductor chip is electrically connected to the third conductor strip, and wherein the second load terminal of each second semiconductor chip is electrically connected to the fifth conductor strip.

7. The electronics assembly of claim 6, further comprising a plurality of second interference-suppression capacitors arranged on the conductor structure and each comprise a first capacitor terminal and a second capacitor terminal, wherein the first capacitor terminal of each second interference-suppression capacitor is electrically connected to the fifth conductor strip, and wherein the second capacitor terminal of each second interference-suppression capacitor is electrically connected to the second conductor strip and/or to a fourth conductor strip of the conductor structure.

8. The electronics assembly of claim 7, wherein the second interference-suppression capacitors are arranged in a row which extends in a first direction.

9. The electronics assembly of claim wherein the number of second interference-suppression capacitors is greater than or equal to the number of second semiconductor chips.

10. The electronics assembly of claim 7, wherein the second interference-suppression capacitors are capacitors of class Y according to the standard IEC 60384-1.

11. The electronics assembly of claim 7, wherein the second interference-suppression capacitors are surface mounted devices.

12. The electronics assembly of claim 7, further comprising a plurality of DC link capacitors arranged on the conductor structure and each comprising a first capacitor terminal and a second capacitor terminal, wherein the first capacitor terminal of each DC link capacitor is electrically connected to the first conductor strip, and wherein the second capacitor terminal of each second DC link capacitor is electrically connected to the fifth conductor strip of the conductor structure.

13. The electronics assembly of claim 12, wherein the DC link capacitors are arranged in a row which extends in a first direction.

14. The electronics assembly of claim 12, wherein the DC link capacitors are capacitors of class X according to the standard IEC 60384-1.

15. The electronics assembly of claim 12, wherein the DC link capacitors are surface mounted devices.

16. The electronics assembly of claim 7, further comprising:
a first terminal for feeding a first supply potential;
a second terminal for feeding a second supply potential;
a first stray capacitance formed between the first terminal and the third conductor strip; and
a second stray capacitance formed between the second terminal and the third conductor strip,
wherein the ratio between the first stray capacitance and the second stray capacitance is less than 0.5 or greater than 2.0.

17. The electronics assembly of claim 1, wherein the first semiconductor chips are arranged on or embedded in the conductor structure.

18. The electronics assembly of claim 1, wherein the conductor structure is a circuit board.

19. The electronics assembly of claim 18, wherein the circuit board is free from via holes.

20. The electronics assembly of claim 1, wherein the conductor structure further comprises a fourth conductor strip electrically connected to the second conductor strip, and wherein the first conductor strip and the fifth conductor strip are arranged between the second conductor strip and the fourth conductor strip.

21. A method for operating an electronics assembly that comprises a plurality of first semiconductor chips each comprising a first load terminal and a second load terminal, a conductor structure comprising a first conductor strip, a second conductor strip and a third conductor strip, a plurality of first interference-suppression capacitors arranged on the conductor structure and each comprising a first capacitor terminal and a second capacitor terminal, and a heat sink, the method comprising:
electrically connecting the first load terminal of each first semiconductor chip to the first conductor strip;
electrically connecting the second load terminal of each first semiconductor chip to the third conductor strip;
electrically connecting the first capacitor terminal of each first interference-suppression capacitor to the first conductor strip;
electrically connecting the second capacitor terminal of each first interference-suppression capacitor to the second conductor strip; and
electrically connecting the heat sink to the second conductor strip and to ground.

* * * * *